(12) United States Patent
Ewe et al.

(10) Patent No.: US 8,201,326 B2
(45) Date of Patent: Jun. 19, 2012

(54) METHOD OF MANUFACTURING A SEMICONDUCTOR DEVICE

(75) Inventors: Henrik Ewe, Burglengenfeld (DE); Joachim Mahler, Regensburg (DE); Anton Prueckl, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 669 days.

(21) Appl. No.: 12/342,266

(22) Filed: Dec. 23, 2008

(65) Prior Publication Data

US 2010/0157568 A1    Jun. 24, 2010

(51) Int. Cl.
*H05K 3/30* (2006.01)
(52) U.S. Cl. ............ 29/832; 29/825; 29/830; 29/840; 438/55; 438/107
(58) Field of Classification Search ............ 29/825, 29/830, 832, 840, 852; 438/55, 107
See application file for complete search history.

(56) References Cited

U.S. PATENT DOCUMENTS

| 7,750,452 | B2* | 7/2010 | Do et al. ............... 257/686 |
| 8,021,907 | B2* | 9/2011 | Pagaila et al. .......... 438/55 |
| 2008/0251903 | A1 | 10/2008 | Otremba et al. |
| 2010/0044885 | A1* | 2/2010 | Fuergut et al. ........ 257/784 |
| 2010/0172113 | A1* | 7/2010 | Lam ................... 361/783 |
| 2010/0233852 | A1* | 9/2010 | Do et al. ............... 438/109 |

FOREIGN PATENT DOCUMENTS

| DE | 102007017831 A1 | 10/2008 |
| EP | 1230680 B1 | 5/2001 |
| WO | 0137338 A3 | 5/2001 |

* cited by examiner

*Primary Examiner* — Carl Arbes
(74) *Attorney, Agent, or Firm* — Dicke, Billig & Czaja, PLLC

(57) ABSTRACT

One aspect is a method of manufacturing a semiconductor device and semiconductor device. One embodiment provides a plurality of modules. Each of the modules includes a carrier and at least one semiconductor chip attached to the carrier. A dielectric layer is applied to the modules to form a workpiece. The dielectric layer is structured to open at least one of the semiconductor chips. The workpiece is singulated to obtain a plurality of devices.

20 Claims, 15 Drawing Sheets

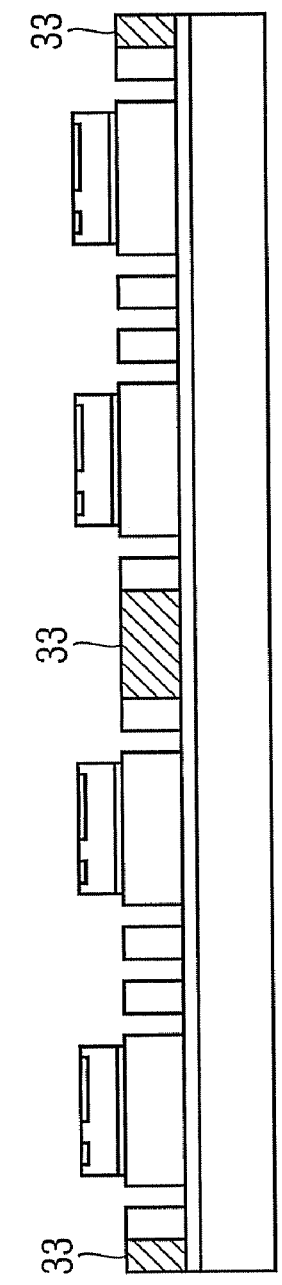
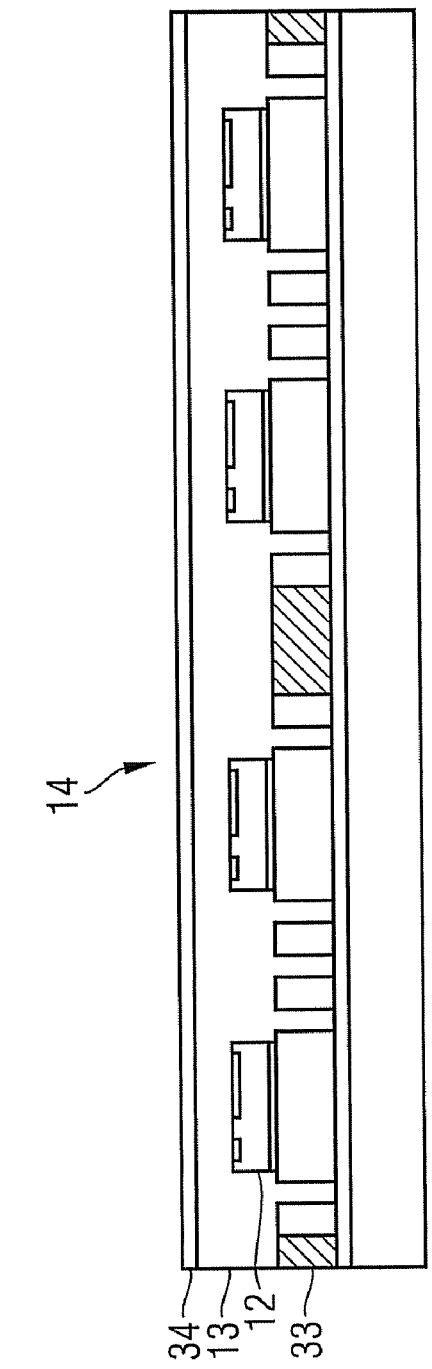
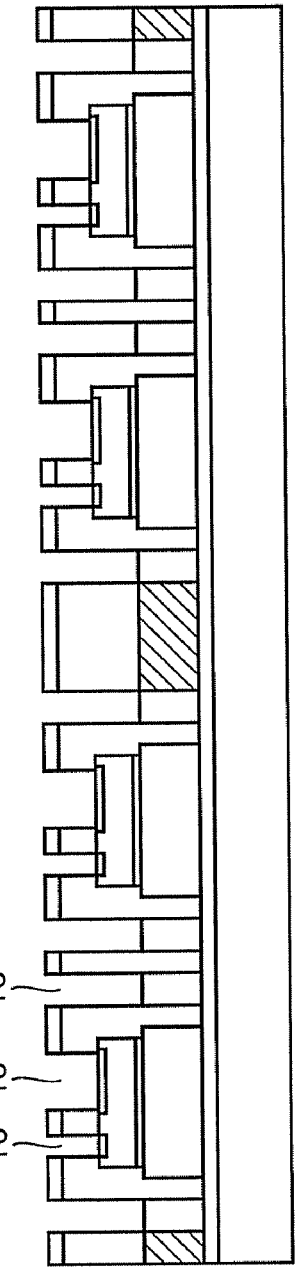
FIG 5D
FIG 5E
FIG 5F

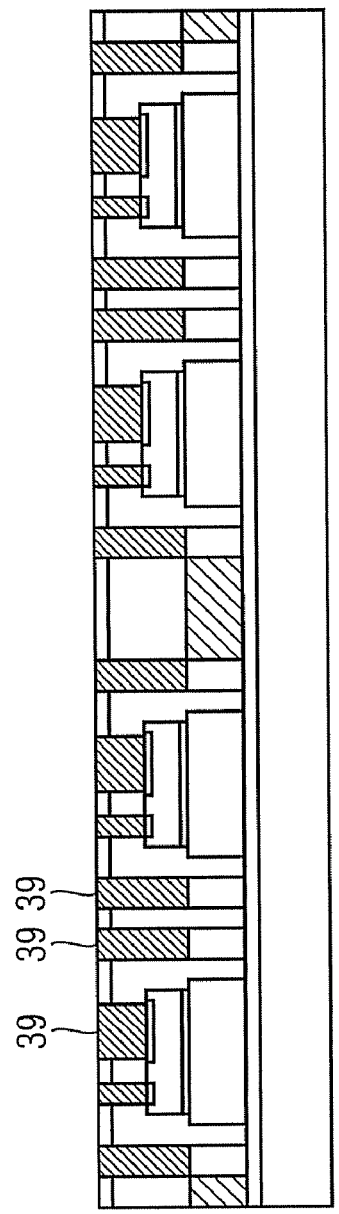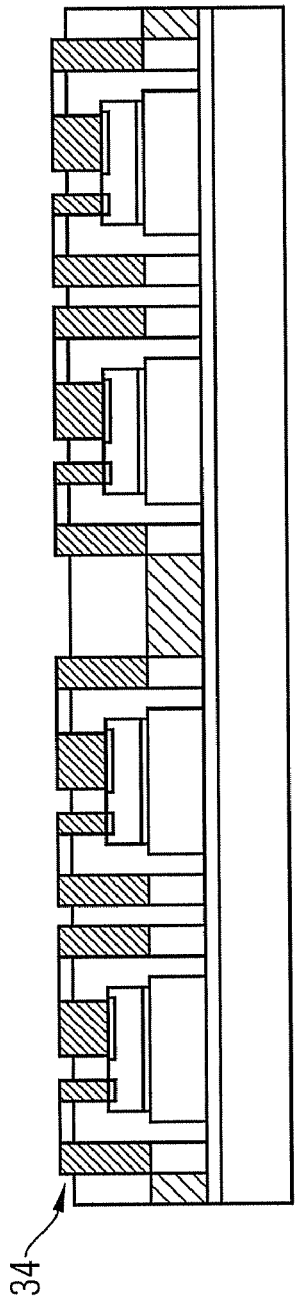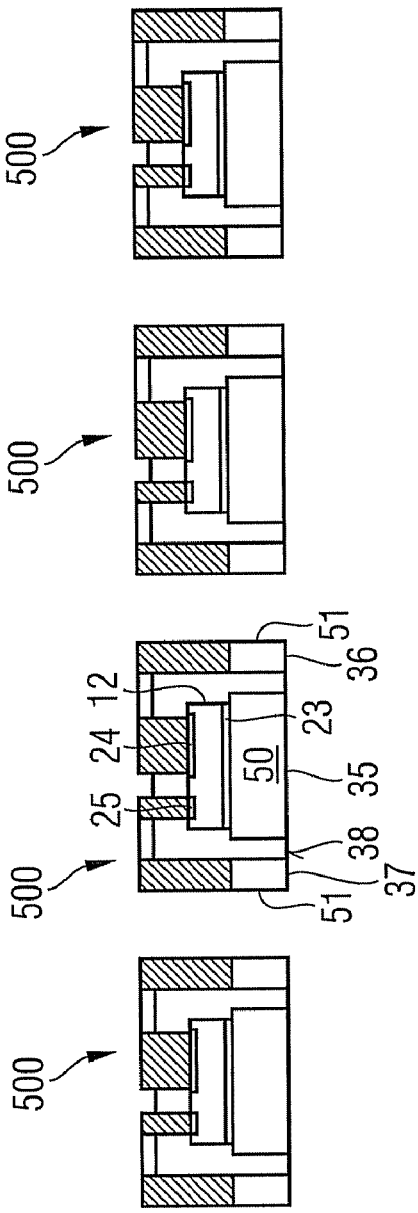
FIG 5G
FIG 5H
FIG 5I

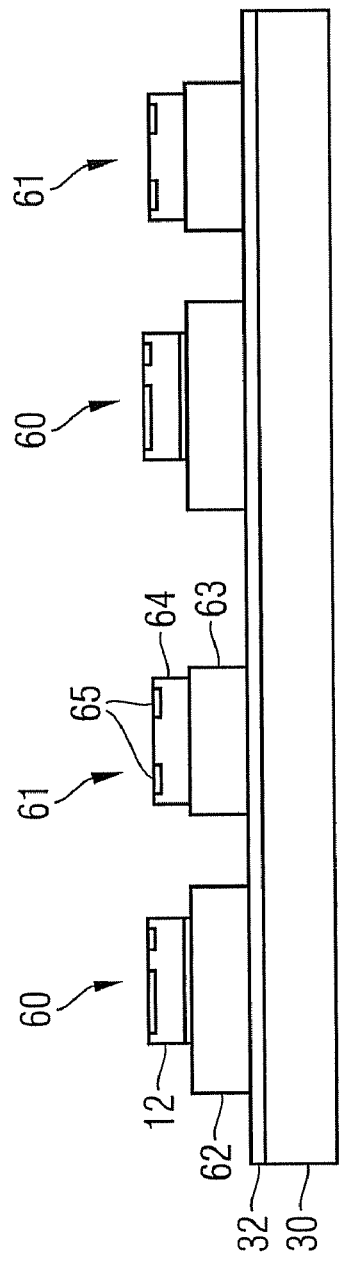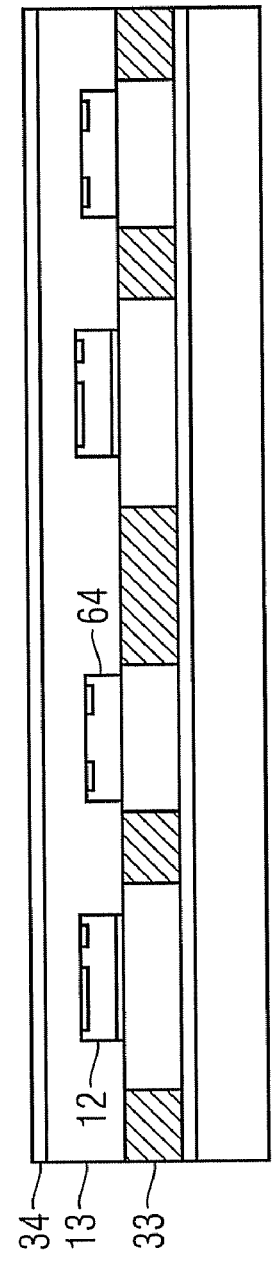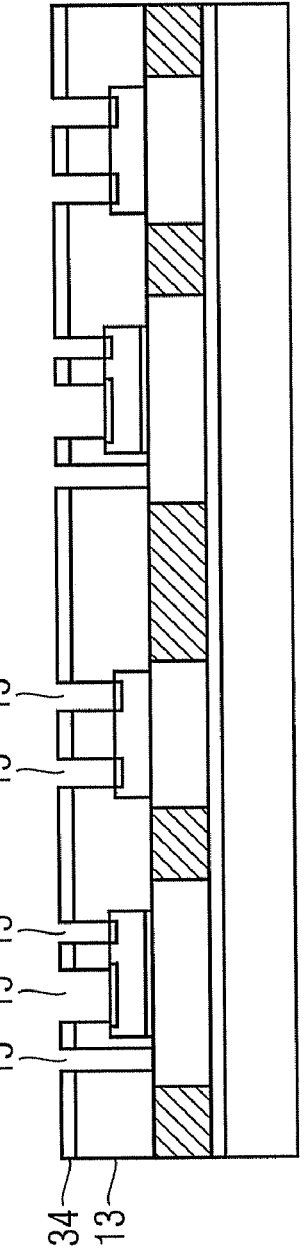

US 8,201,326 B2

METHOD OF MANUFACTURING A SEMICONDUCTOR DEVICE

BACKGROUND

This invention relates to a method of manufacturing a semiconductor device as well as a semiconductor device.

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging semiconductor chips increases the cost and complexity of manufacturing semiconductor devices because the packaging designs do not only provide protection, they also permit transmission of electrical signals to and from the semiconductor chips and, in particular, removal of heat generated by the semiconductor chips.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 5A to 5I schematically illustrate a cross-sectional view of one embodiment of a method of manufacturing a device including attaching semiconductor chips to structured carriers, applying a dielectric layer to the semiconductor chips, structuring the dielectric layer and singulating the semiconductor chips.

FIGS. 6A to 6G schematically illustrate a cross-sectional view of one embodiment of a method of manufacturing a device including attaching exactly one semiconductor chip to each carrier, applying a dielectric layer to the semiconductor chips, structuring the dielectric layer and singulating the semiconductor chips.

DETAILED DESCRIPTION

Figure 1A:
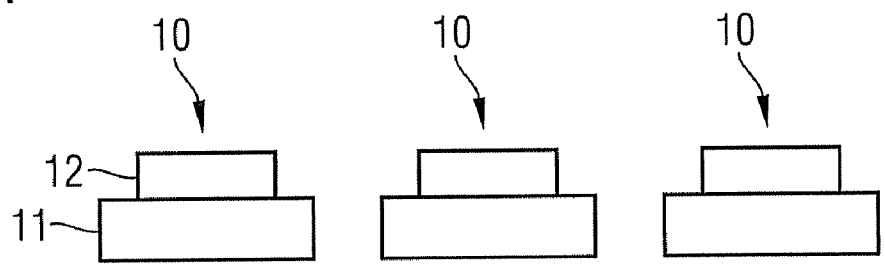
FIGS. 1A to 1D schematically illustrate a cross-sectional view of one embodiment of a method of manufacturing a device including providing modules with semiconductor chips attached to carriers, applying a dielectric layer to the modules, structuring the dielectric layer and singulating the semiconductor chips.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. Semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements on its two main faces, that is, on its top side and bottom side. Power semiconductor chips may have a vertical structure. By way of example, the source electrode and gate electrode of a power MOSFET may be situated on one main face, while the drain electrode of the power MOSFET is arranged on the other main face. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, GaN, and, furthermore, may contain inorganic and/or organic materials that are not semiconductors, such as for example insulators, plastics or metals.

The semiconductor chips may have contact elements (or contact pads or electrodes) which allow electrical contact to be made with the integrated circuits included in the semiconductor chips. One or more metal layers may be applied to the contact elements of the semiconductor chips. The metal layers may be manufactured with any desired geometric shape and any desired material composition. The metal layers may, for example, be in the form of a layer covering an area. Any desired metal or metal alloy, for example from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers. The carriers may be of any shape, size or material. According to one embodiment, the carriers may be electrically conductive. They may be fabricated from metals or metal alloys, for example, copper, copper alloys, iron nickel, aluminum, aluminum alloys, or other appropriate materials. The carriers may be metal plates or metal foils. The carriers may be unstructured or structured and may be, for example, a leadframe or a part of a leadframe. Furthermore, the carriers may be plated with an electrically conductive material, for example copper, silver, iron nickel or nickel phosphorus. According to one embodiment, the carriers may be electrically insulating and may, for example, be made of a polymer material, for example a prepreg material. Moreover, the carriers may be embodied as a PCB (printed circuit board) or a DCB (direct copper bonded), which includes a ceramic carrier, for example made of $Al_2O_3$, AlN, BN or TiN, and copper coatings on both sides.

The devices may include a dielectric layer. The dielectric layer may cover any fraction of any number of surfaces of the components of the device. The dielectric layer may serve various functions. It may be used, for example, to electrically insulate components of the device from each other and/or from external components, but the dielectric layer may also be used as a platform to mount other components, for example wiring layers. The dielectric layer may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The dielectric layer may, for example, be laminated on the components of the device. In this case, the dielectric layer may, for example, be made of a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the dielectric material are: FR-2, FR-3, FR-4, FR-5, FR-6, G-10, CEM-1, CEM-2, CEM-3, CEM-4 and CEM-5. Instead of lamination, the dielectric material may also be deposited by printing or from a gas phase or a solution or by compression molding, injection molding, powder molding, potting, dispensing, jetting or any other appropriate method. The dielectric material may, for example, be any appropriate duroplastic, thermoplastic or thermosetting material.

One or more through-holes may be created in the dielectric layer. The through-holes may, for example, expose portions of the semiconductor chips to allow electrical connections to be made to the semiconductor chips.

One or more metal layers may be attached to the dielectric layer. The metal layers may, for example, be used to produce a redistribution layer. The metal layers may be used as wiring layers to make electrical contact with the semiconductor chips from outside the devices or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metals, for example copper, aluminum, nickel, palladium, silver, tin or gold, metal alloys or metal stacks may be used as the material. The metal layers need not be homogenous or manufactured from just one material, that is to say various compositions and concentrations of the materials contained in the metal layers are possible.

The devices described below include external contact elements, which may be of any shape, size and material. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material. The external contact elements may include external contact pads. Solder material may be deposited on the external contact pads.

Figure 1B:
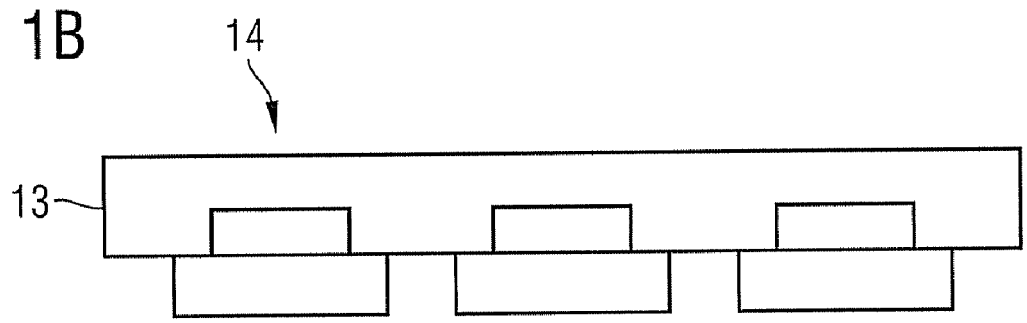
Figure 1C:
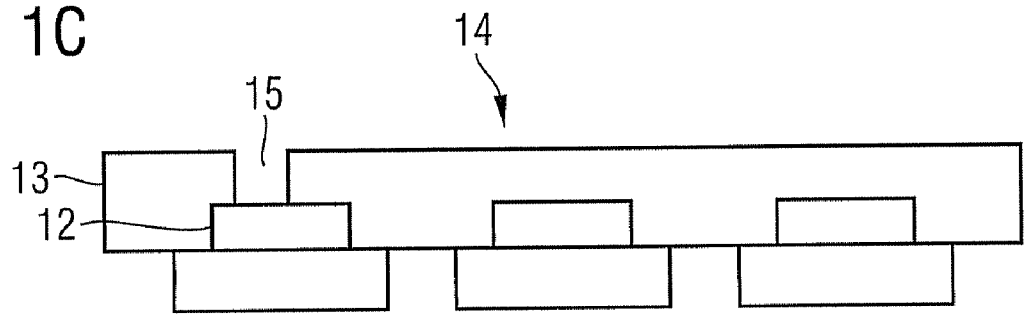
Figure 1D:
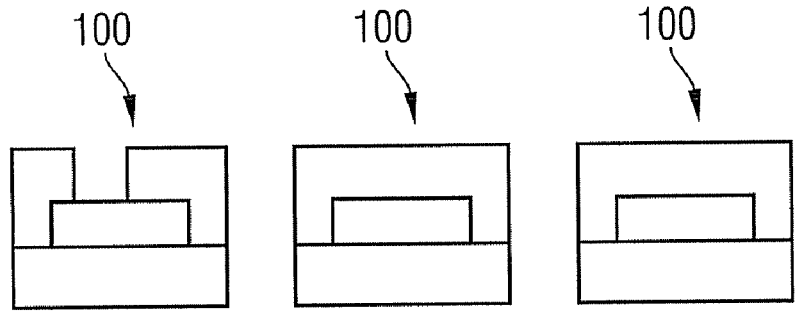

FIGS. 1A to 1D schematically illustrate a cross-sectional view of one embodiment of a method of manufacturing a device 100, which is illustrated in FIG. 1D. As illustrated in FIG. 1A, a plurality of modules 10 are provided. Each of the modules 10 includes a carrier 11 and at least one semiconductor chip 12 attached to the carrier 11. A dielectric layer 13 is applied the modules 10 to form a workpiece 14 as illustrated in FIG. 1B. The workpiece 14 includes the carriers 11, the semiconductor chips 12 and the dielectric layer 13. The dielectric layer 13 is then structured to open at least one of the semiconductor chips 12. For example, a through-hole 15 is created in the dielectric layer 13 as illustrated in FIG. 1C. The workpiece 14 is singulated to obtain a plurality of devices 100 as illustrated in FIG. 1D.

Figure 2A:
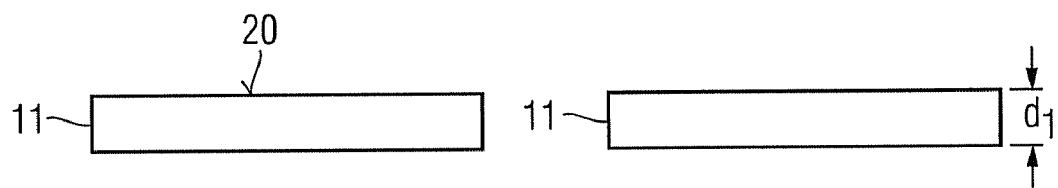
FIGS. 2A to 2K schematically illustrate a cross-sectional view of one embodiment of a method of manufacturing a device including attaching semiconductor chips to carriers, applying a dielectric layer to the semiconductor chips, structuring the dielectric layer and singulating the semiconductor chips.
Figure 2B:
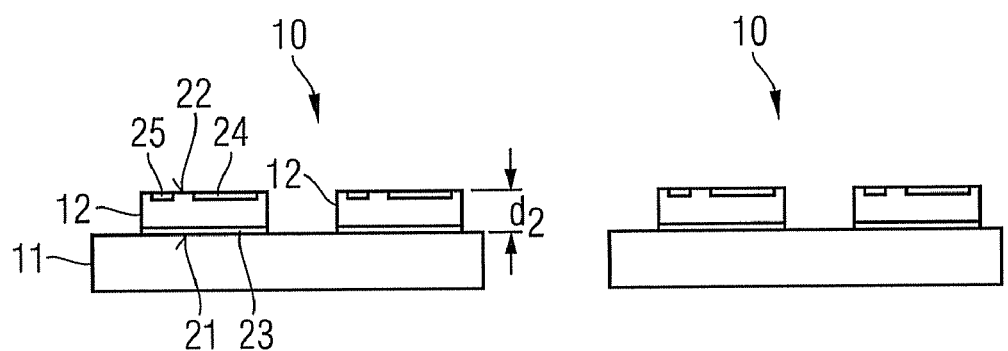
Figure 2C:
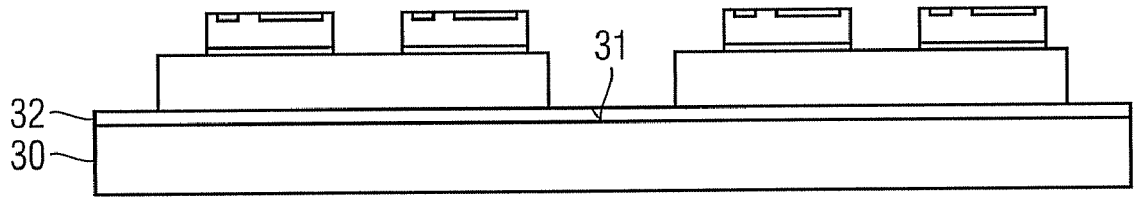
Figure 2D:
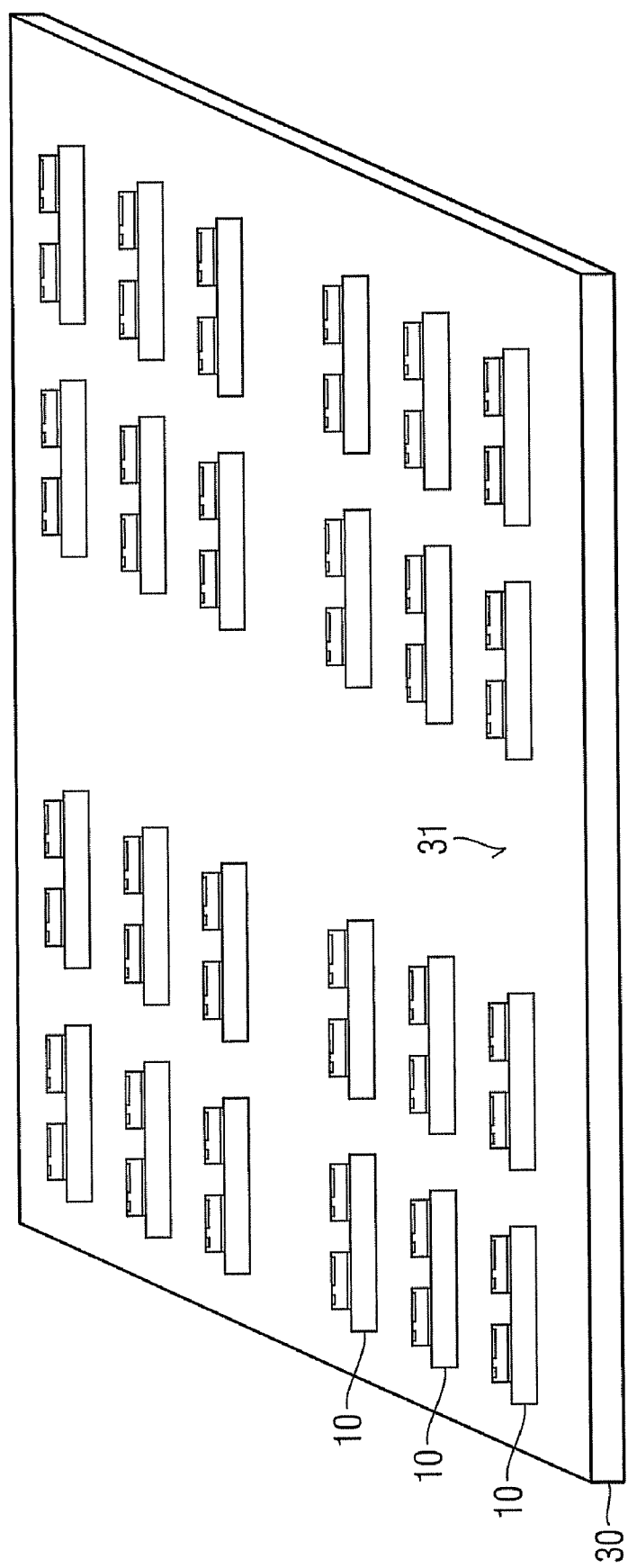
Figure 2E:
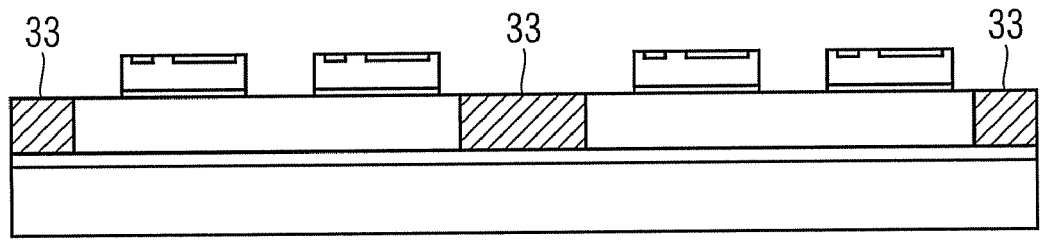
Figure 2F:
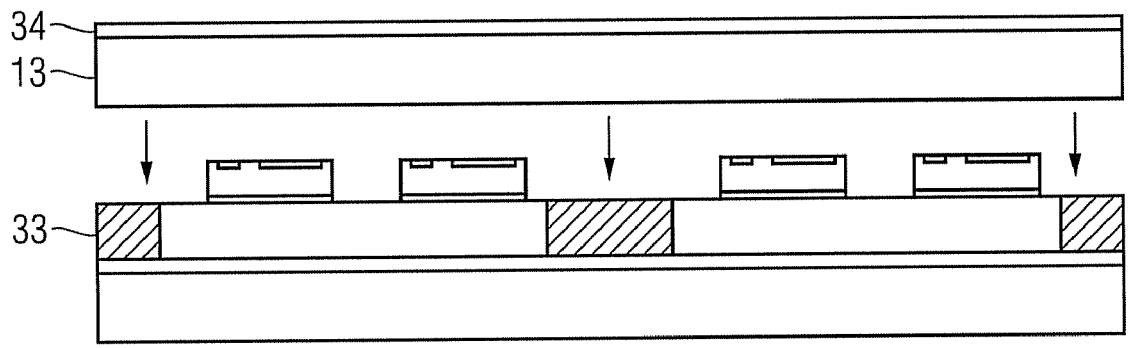
Figure 2G:
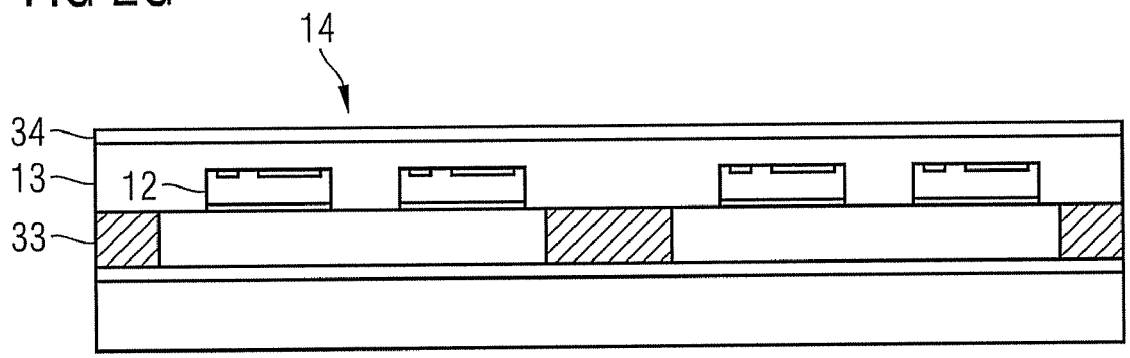
Figure 2H:
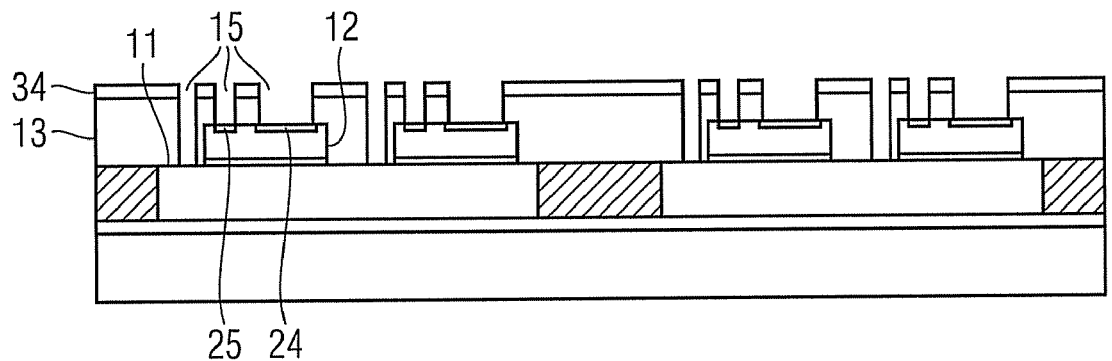
Figure 2I:
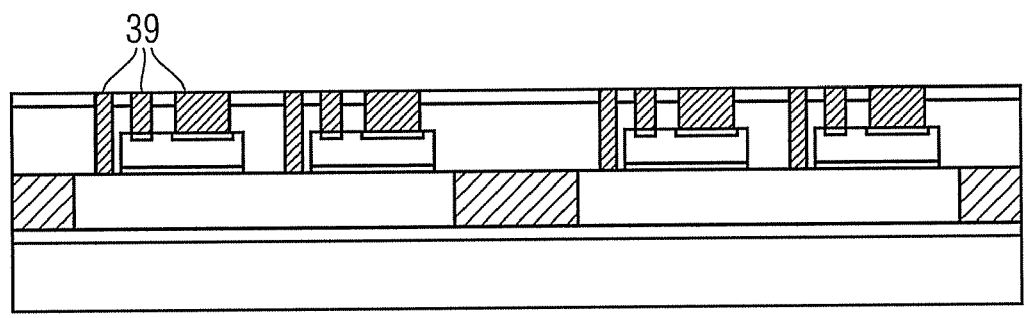
Figure 2J:
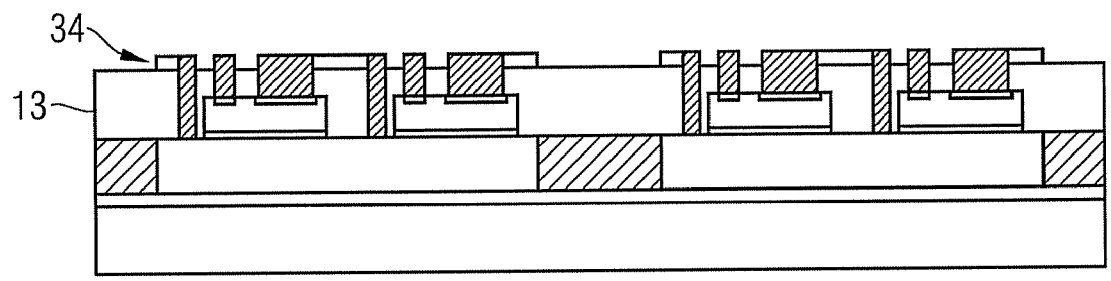
Figure 2K:
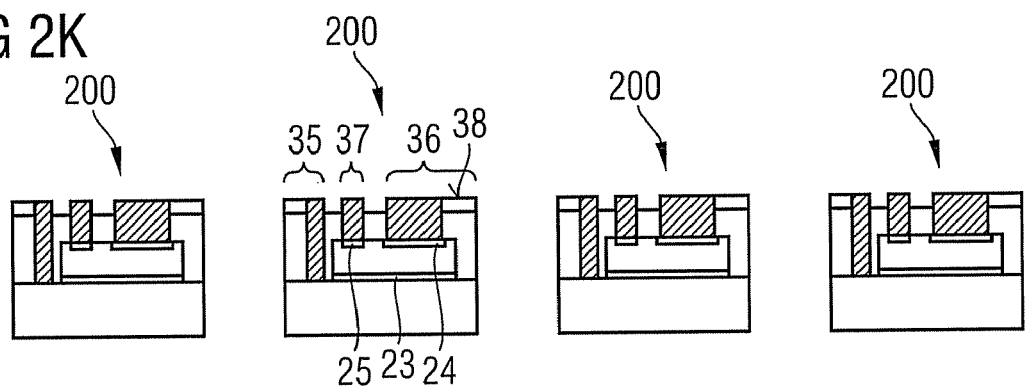

FIGS. 2A to 2K schematically illustrate a cross-sectional view of one embodiment of a method of manufacturing a device 200, which is illustrated in FIG. 2K. The method that is illustrated in FIGS. 2A to 2K is an implementation of the method illustrated in FIGS. 1A to 1D. The details of the method that are described below can therefore be likewise applied to the method of FIGS. 1A to 1D. Similar or identical components of the devices 100 and 200 are denoted by the same reference numerals.

As illustrated in FIG. 2A, a plurality of carriers 11 is provided. In the present embodiment, the carriers 11 are electrically conductive and are not connected to each other when provided. Each of the carriers 11 may be a plate or a foil made of a rigid material, for example a metal or a metal alloy, such as copper, aluminum, nickel, CuFeP, steel or stainless steel. Moreover, the carriers 11 may be plated with an electrically conductive material, for example copper, silver, iron nickel or nickel phosphorus. The carriers 11 may have flat upper faces 20 on which the semiconductor chips 12 are placed later on. The shape of the carriers 11 is not limited to any geometric shape, and the carriers 11 may have any appropriate size. For example, the thickness $d_1$ of the carriers 11 may be in the range from 50 to 500 μm and in particular in the range from 200 to 300 μm.

The semiconductor chips 12 may be placed over the upper faces 20 of the carriers 11. Any number of the semiconductor chips 12 may be placed over each of the carriers 11, for example two semiconductor chips 12 per carrier 11 as illustrated in FIG. 2B or even more semiconductor chips 12. The semiconductor chips 12 are relocated on the carriers 11 in larger spacing as they have been in the wafer bond. The semiconductor chips 12 may have been manufactured on the same semiconductor wafer, but may have been manufactured on different wafers. Furthermore, the semiconductor chips 12 may be physically identical, but may also contain different integrated circuits and/or represent other components and/or may have different outer dimensions and/or geometries. The semiconductor chips 12 may have a thickness $d_2$ in the range between 40 μm and several hundred micrometers, in particular in the range between 50 and 80 μm. The semiconductor chips 12 may be placed over the carriers 11 with their first faces 21 facing the carriers 11 and their second faces 22 opposite to the first faces 21 facing away from the carriers 11.

Each of the semiconductor chips 12 may have a first electrode 23 on the first face 21 and a second electrode 24 on the second face 22. The first and second electrodes 23, 24 may be load electrodes. Furthermore, each of the semiconductor chips 12 may have a third electrode 25 on its second face 22 functioning as a control electrode. The semiconductor chips 12 may be configured as vertical power semiconductor chips and may include power diodes or power transistors, for example power MOSFETs, IGBTs, JFETs or power bipolar transistors. In the case of a power MOSFET or a JFET, the first load electrode 23 is a drain electrode, the second load electrode 24 is a source electrode, and the control electrode 25 is a gate electrode. In the case of an IGBT, the first load electrode 23 is a collector electrode, the second load electrode 24 is an emitter electrode, and the control electrode 25 is a gate electrode. In the case of a power bipolar transistor, the first load electrode 23 is a collector electrode, the second load electrode 24 is an emitter electrode, and the control electrode 25 is a base electrode. In case of a power diode, the first and second load electrodes 23 and 24 are cathode and anode, respectively. During operation, voltages of up to 5, 50, 100, 500 or 1000 V or even higher may be applied between the load electrodes 23 and 24. The switching frequency applied to the control electrode 25 may be in the range from 1 kHz to several GHz.

The first electrodes 23 of the semiconductor chips 12 may be firmly attached and electrically connected to the respective electrically conductive carrier 11. The electrical connections may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the carrier 11 and the respective semiconductor chip 12 on account of interface diffusion processes. In this case, the use of Sn, AuSn, AgSn, CuSn, AgIn, AuIn, CuIn, AuSi or Au solders is conceivable. If the semiconductor chips 12 are adhesively bonded to the carriers 11, it is possible to use electrically conductive adhesives which may be based on epoxy resins and be enriched with gold, silver, nickel or copper in order to produce the electrical conductivity.

The modules 10 obtained by attaching the semiconductor chips 12 to the carriers 11 may be placed over a common carrier 30 as illustrated in FIG. 2C. The carrier 30 may be a plate made of a rigid material, for example a metal, such as nickel, steel or stainless steel, laminate, film, polymer composites, ceramics or a material stack. The carrier 30 may have at least one flat surface 31 on which the modules 10 can be placed. The shape of the carrier 30 is not limited to any geometric shape, for example the carrier 30 may be round or square-shaped. The carrier 30 may have any appropriate size. An adhesive tape 32, for example a double sided sticky tape, may be laminated onto the carrier 30.

The surface area of the surface 31 of the carrier 30 may be at least 10 or 20 or 50 or 100 times larger than the surface area of the surface 20 of the carriers 11. The carrier 30 may have a size that may be used in PCB processing technologies, for example the carrier 30 may have dimensions of 45×60 cm². More than 10 or 50 or 100 or 500 of the modules 10 may be placed on the carrier 30. The modules 10 may be arranged in arrays or in arrays of arrays as exemplarily illustrated in FIG. 2D in a perspective view.

The gaps between the modules 10 may be at least temporarily covered with a template 33 as illustrated in FIG. 2E. The template 33 may, for example, be made of a prepreg foil, and openings may have been formed in the prepreg foil at places where the modules 10 are situated. The thickness of the template 33 may be similar to the thickness $d_1$ of the carriers 11, but may also be different. The purpose of the template 33 is to compensate level differences before depositing the dielectric layer 13. In case the template 33 and the carriers 11 have the same height, the level differences of the gaps between the modules 10 are fully balanced.

The dielectric layer 13 may then be placed over the modules 10 and the template 33 as illustrated in FIG. 2F. Furthermore, the top of the dielectric layer 13 may be coated with a metal layer 34, for example a copper layer. The dielectric layer 13 may encapsulate the modules 10 as illustrated in FIG. 2G. The dielectric layer 13 may be made of an electrically insulating polymer material, which may have the shape of a foil or sheet and which is laminated on top of the semiconductor chips 12 as well as the carriers 11. Heat and/or pressure may be applied for a time suitable to attach the polymer foil or sheet 13 to the underlying structure. The gaps between the semiconductor chips 12 are also filled with the polymer material 13. The polymer material 13 may, for example, be a prepreg that is a combination of a fiber mat, for example glass or carbon fibers, and a resin, for example a duroplastic material. Prepreg materials are usually used to manufacture PCBs. Well known prepreg materials that are used in PCB industry and that can be used here as the polymer material 13 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 12 and hardened during a heat-treatment. For the lamination of the prepreg the same or similar processes can be used as in PCB manufacturing. Furthermore, the dielectric layer 13 together with the metal layer 34 may be a RCC (resin coated copper). The dielectric layer 13 may have at least the same thickness as the semiconductor chips 12, but may also be thicker. For example, the thickness of the laminated dielectric layer 13 may be in the range from 50 to 500 μm or in particular in the range from 70 to 300 μm, but may also be outside these ranges.

Instead of lamination, the dielectric layer 13 may be deposited by printing or from a gas phase or a solution or by compression molding, injection molding, powder molding, potting, dispensing, jetting or any other appropriate method.

The dielectric layer 13 together with the modules 10 forms a lamination workpiece 14. After the fabrication of the lamination workpiece 14 or at a later process, the lamination workpiece 14 may be released from the carrier 30, and the adhesive tape 32 may be pealed from the lamination workpiece 14. The adhesive tape 32 may feature thermo-release properties, which allow the removal of the adhesive tape 32 during a heat-treatment. The removal of the adhesive tape 32 from the carrier 30 is carried out at an appropriate temperature, which depends on the thermo-release properties of the adhesive tape 32 and is usually higher than 150° C.

The dielectric layer 13 together with the metal layer 34 may be structured as illustrated in FIG. 2H. A plurality of cutouts or through-holes 15 are created in the metal layer 34 and the dielectric layer 13 to expose at least portions of the second electrodes 24 and the control electrodes 25 of the semiconductor chips 12 as well as portions of the upper surface of the carriers 11 so that electrical connections can be made to those exposed regions. The metal layer 34 and the dielectric layer 12 may be structured by etching or by using laser ablation.

The through-holes 15 may be filled with an electrically conductive material 39, for example a metal or metal alloy, as illustrated in FIG. 2I. The electrically conductive material 39 may be deposited by chemical deposition and/or electroless and/or galvanic plating processes. Thereby a seed layer is first chemically or electroless deposited onto the surfaces of the through-holes 15. Materials such as suitable polymers or palladium or titanium may be used for the seed layer which usually has a thickness of less than 1 μm. The thickness of the seed layer may be increased by depositing a further layer of an electrically conductive material onto the seed layer. For example, a layer of copper may be electroless deposited onto the seed layer. This copper layer may have a thickness of less than 1 μm. Afterwards another layer of copper may be galvanically deposited, which may have a thickness of more than 5 μm. The electroless copper deposition may also be omitted. It may be sufficient to cover only the walls of the through-holes 15 with the electrically conductive materials 39, however the through-holes 15 may also be completely filled.

As illustrated in FIG. 2J, the metal layer 34 on top of the dielectric layer 13 may be structured in order to produce the footprint of the devices 200. For this purpose a dry resist film may be laminated on the top of the metal layer 34 (not illustrated in FIG. 2J), which is photostructurable. Recesses may be formed in the resist film by exposure to light having a suitable wave-length. For that, a laser beam or light exposure through a mask may be employed. Subsequently, the resist film is developed and the thereby exposed portions of the metal layer 34 are etched. Afterwards the resist film is stripped off, and only the structured metal layer 34 remains on the dielectric layer 13 as illustrated in FIG. 2J.

As illustrated in FIG. 2K, the devices 200 are separated from one another by separation of the dielectric layer 13 and the carriers 11. Singulation of the devices 200 may be carried out for example by sawing, cutting, milling, laser ablation or etching. In the devices 200 the structured metal layer 34 serves as a redistribution layer and forms external contact elements 35, 36 and 37, which are electrically coupled to the first electrode 23, the second electrode 24 and the control electrode 25 of the semiconductor chip 12, respectively. The upper surface 38 of the metal layer 34 is a mounting surface which can be used to mount the device 200 on another components, for example a circuit board. The redistribution layer may consist of a single metal layer as illustrated in FIG. 2K, but may also include more than one metal layer.

The devices 200 manufactured by the method described above are fan-out type packages. The dielectric layer 13 allows the redistribution layer to extend beyond the outline of the semiconductor chip 12. The external contact elements 35, 36 and 37 therefore do not need to be arranged within the outline of the semiconductor chip 12 but can be distributed over a larger area. The increased area which is available for arrangement of the external contact elements 35, 36 and 37 as a result of the dielectric layer 13 means that the external contact elements 35, 36 and 37 cannot only be arranged at a great distance from one another, but that the maximum number of external contact elements 35, 36 and 37 which can be arranged there is likewise increased compared to the situation when all the external contact elements 35, 36 and 37 are arranged within the outline of the semiconductor chip 12.

It is obvious to a person skilled in the art that the devices 200 illustrated in FIG. 2K and the manufacturing thereof as described above are only intended to be an exemplary embodiment, and many variations are possible. For example, further semiconductor chips or passives of different types may be included in the same device 200. The semiconductor chips and passives may differ in function, size, manufacturing technology etc.

In the embodiment described above and illustrated in FIGS. 2A to 2K, each of the modules 10 includes the same carrier 11, which is electrically conductive. It may also be provided that different carriers 11 are used, for example at least two different carriers. Furthermore, different semiconductor chips may be attached to the carriers. In this case the type of carrier may be chosen according to the type of semiconductor chip which is attached to the respective carrier. Furthermore, electrically insulating carriers may be used, which may, for example, be made of a ceramic substrate, a laminated substrate or a polymer substrate, for example a prepreg substrate. It may also be provided that exactly one semiconductor chip is attached to each carrier.

Figure 3A:
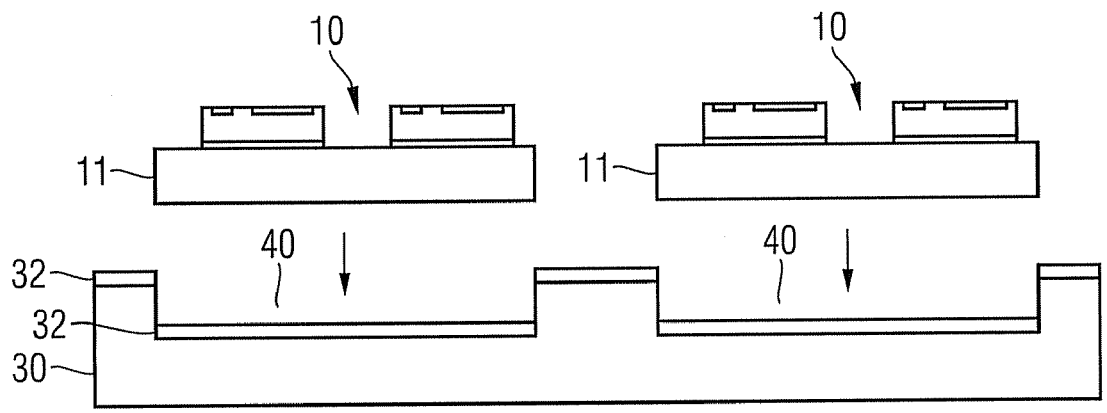
FIGS. 3A to 3C schematically illustrate a cross-sectional view of a variation of the method illustrated in FIGS. 2A to 2K.
Figure 3B:
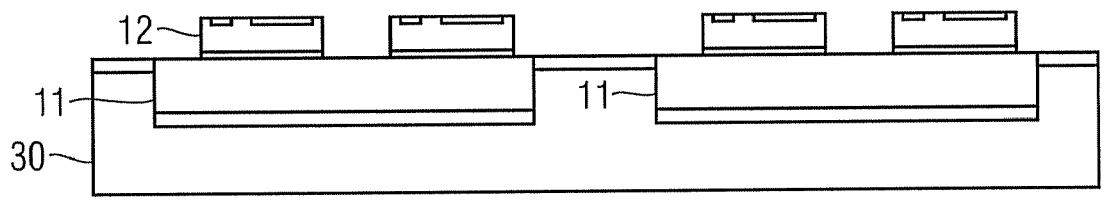
Figure 3C:
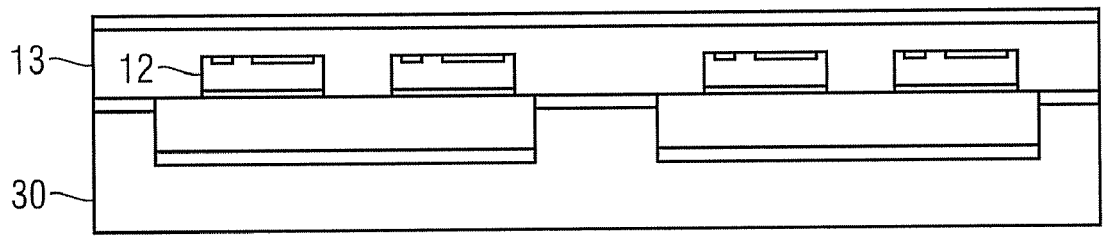

In the fabrication process illustrated in FIG. 2E, the gaps between the modules 10 are covered with the template 33 in order to compensate level differences prior to the deposition of the dielectric layer 13. Instead of the template 33, a thermoplastic material may be used to fill the gaps between the modules 10 placed on the common carrier 30. The thermoplastic material may be removed later on by selective etching. Furthermore, the common carrier 30 may have recesses 40, which have the dimensions of the carriers 11 of the modules 10 as illustrated in FIG. 3A. Thus the recesses 40 can receive the carriers 11 as illustrated in FIG. 3B, and the dielectric layer 13 can be deposited on a structure with has height differences of less than 100 μm and in particular less than 80 μm as illustrated in FIG. 3C. As a further alternative, a common carrier 30 may be used that is soft and shapeable enough so that the modules 10 can be pressed into the carrier 30 such that the carrier 30 fills the gaps between the modules 10.

Figure 4A:
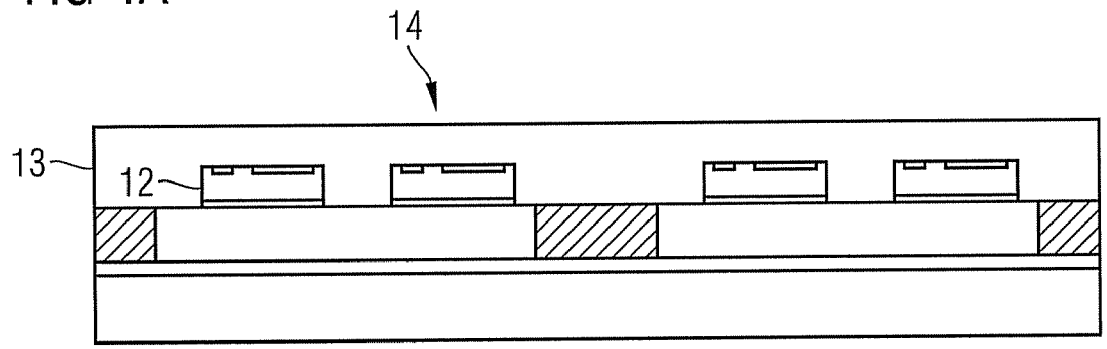
FIGS. 4A to 4F schematically illustrate a cross-sectional view of a further variation of the method illustrated in FIGS. 2A to 2K.
Figure 4B:
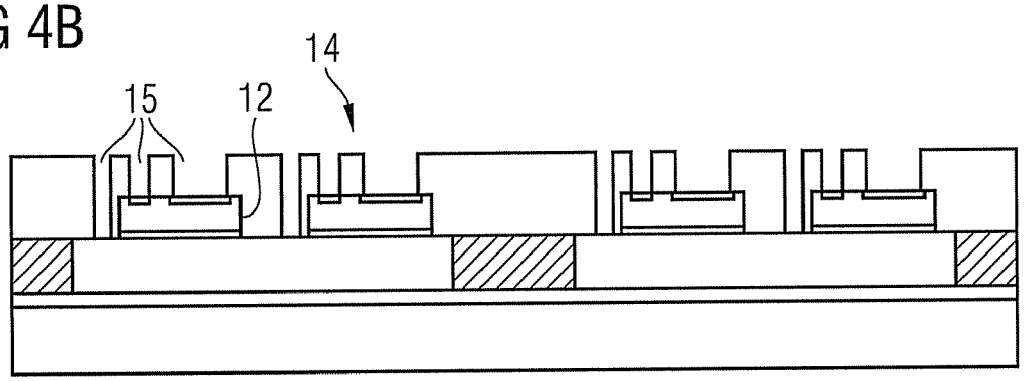
Figure 4C:
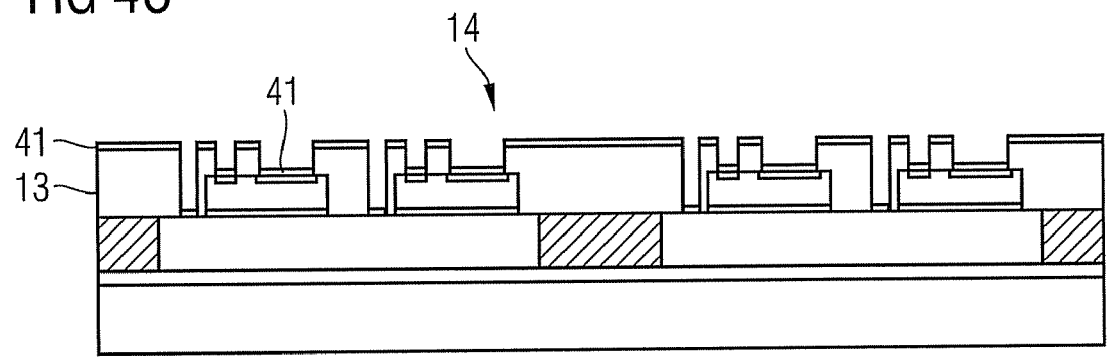

According to one embodiment, the dielectric layer 13 is deposited on the semiconductor chips 12 and the carriers 11 without having the metal layer 34 on top. Such an embodiment is schematically illustrated in FIGS. 4A to 4F. After the deposition of the dielectric layer 13, for example by lamination, as illustrated in FIG. 4A, the through-holes 15 are created in the dielectric layer 15 as illustrated in FIG. 4B. Afterwards, a seed layer 41 is deposited on the upper surface of the workpiece 14 as illustrated in FIG. 4C. The seed layer 41 may be chemically or electroless deposited onto the workpiece 14.

Materials such as suitable polymers or palladium or titanium may be used for the seed layer which usually has a thickness of less than 1 μm.

Figure 4D:
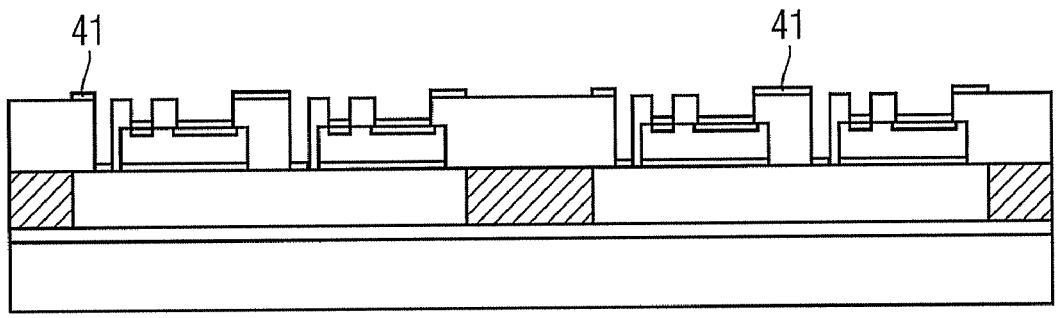
Figure 4E:
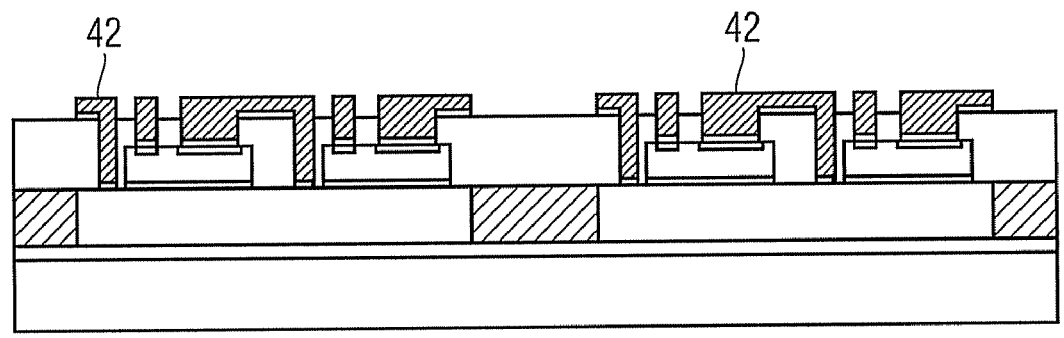
Figure 4F:
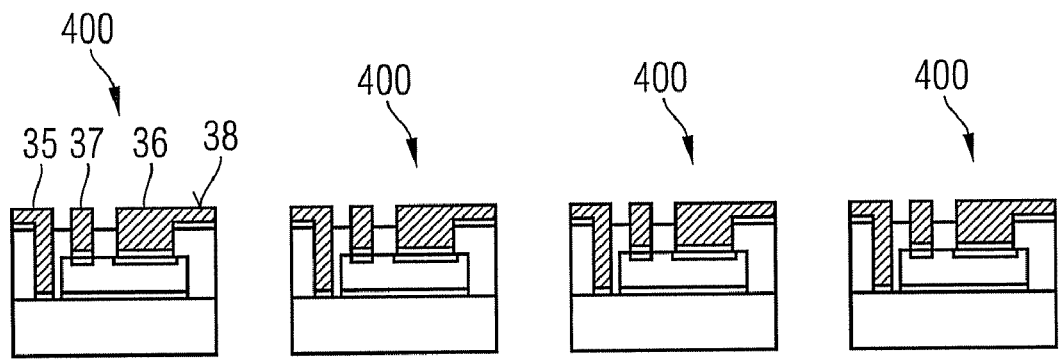

Subsequently, the seed layer 41 may be structured as illustrated in FIG. 4D by using one of the methods described above. After the structuring of the seed layer 41, the thickness of the seed layer 41 may be optionally increased by depositing a further layer of an electrically conductive material onto the seed layer 41. For example, a layer of copper may be electroless deposited onto the seed layer 41. This copper layer may have a thickness of less than 1 μm. Afterwards another layer of copper 42 with a thickness of more than 5 μm may be galvanically deposited as illustrated in FIG. 4E. Thereby the through-holes 15 are filled and the redistribution layer is formed. Then devices 400 are singulated as illustrated in FIG. 4F.

Figure 5A:
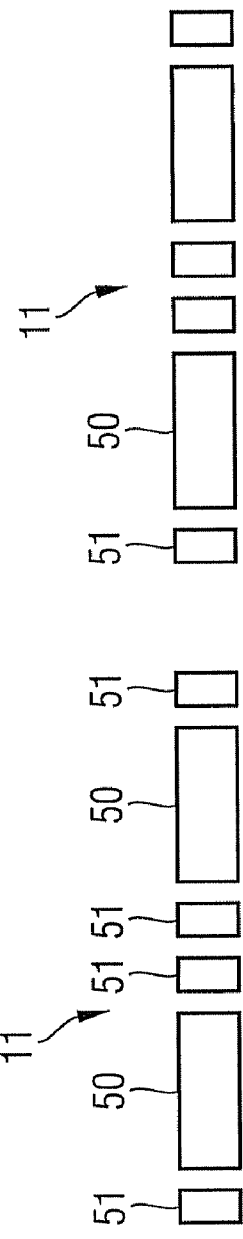
Figure 5B:
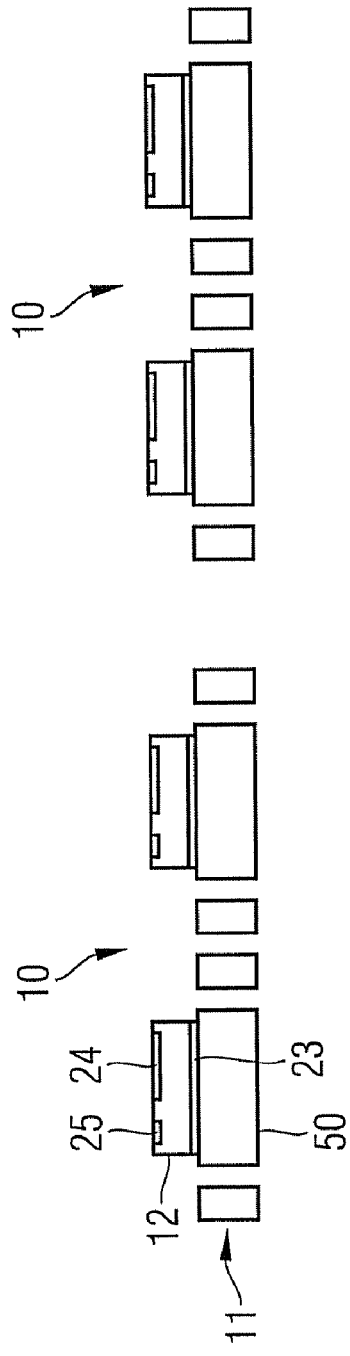
Figure 5C:
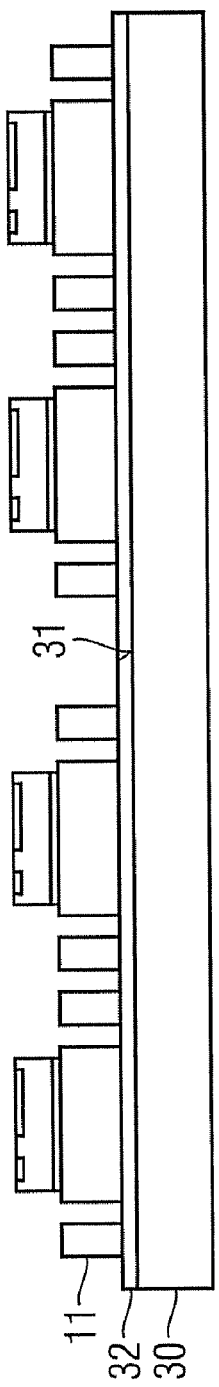

A further variation of the fabrication method illustrated in FIGS. 2A to 2K is schematically illustrated in FIGS. 5A to 5I. The difference between both methods is the use of structured carriers 11 as illustrated in FIG. 5A. The structured carriers 11 may include die-pads 50 and external contact pads 51. The structured carriers 11 may be leadframes and may be fabricated from metals or metal alloys, for example, copper, copper alloys, iron nickel, aluminum, aluminum alloys. Furthermore, the structured carriers 11 may be plated with an electrically conductive material, for example copper, silver, iron nickel or nickel phosphorus. The semiconductor chips 12 may be attached to the die-pads 50 as illustrated in FIG. 5B and described above in connection with FIG. 2B.

The fabrication processes illustrated in FIGS. 5C to 5I may be essentially identical or similar to the fabrication processes illustrated in FIGS. 2C to 2K. The devices 500 obtained by the method of FIGS. 5A to 5I are illustrated in FIG. 5I. In contrast to the device 200, the mounting surface 38 of the device 500 is located on the bottom face of the device 500. The die-pad 50 functions as the external contact element 35, which is electrically coupled to the first electrode 23 of the semiconductor chip 12. The external contact pads 51 function as the external contact elements 36 and 37, which are electrically coupled to the second electrode 24 and the control electrode 25 of the semiconductor chip 12, respectively.

A further variation of the fabrication method illustrated in FIGS. 2A to 2K is schematically illustrated in FIGS. 6A to 6F. In the embodiment illustrated in FIG. 6A modules 60 and 61 are illustrated, each of them containing a carrier and exactly one semiconductor chip attached to the carrier. In the case of the modules 60, the power semiconductor chip 12 is mounted on a carrier 62. In the case of the modules 61, a semiconductor chip 64 is attached to a carrier 63. The semiconductor chip 64 may, for example, include a logic integrated circuit, which can be used to control the power semiconductor chip 12. The semiconductor chip 64 has contact pads 65 on its upper face, which faces away from the carrier 63. Since each of the semiconductor chips 12 and 64 is mounted on an individual carrier, the type of carrier may be adapted to the type of semiconductor chip mounted on the respective carrier. For example, the carrier 62 may be a DCB (direct copper bonded), on which the power semiconductor chip 12 is mounted. The carrier 63 may be a less costly carrier and may be electrically insulating.

Figure 6D:
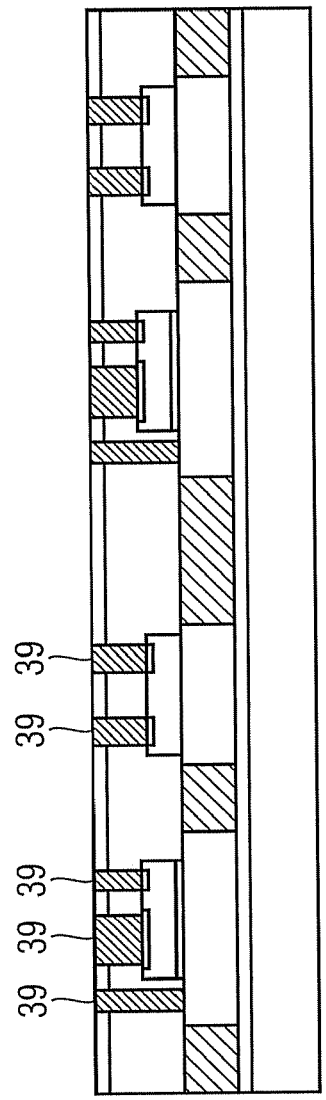
Figure 6E:
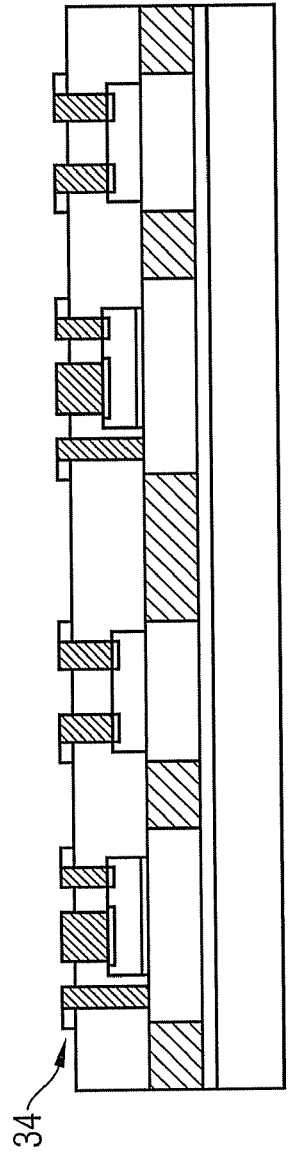
Figure 6F:
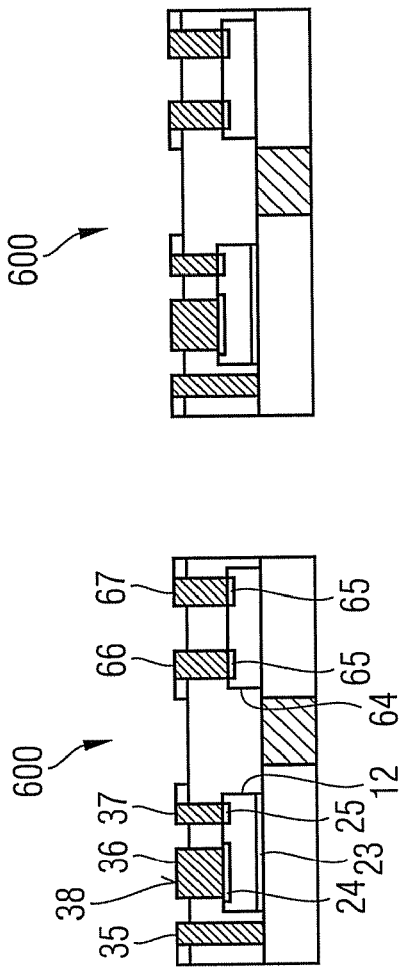

The fabrication processes illustrated in FIGS. 6B to 6F may be essentially identical or similar to the fabrication processes illustrated in FIGS. 2F to 2K. The devices 600 obtained by the method of FIGS. 6A to 6F are illustrated in FIG. 6F. In contrast to the devices 200, each of the devices 600 includes two modules 60 and 61. The external contact elements 35, 36 and 37 can be used to electrically access the power semiconductor chip 12 from outside the device 600, and the semiconductor chip 64 can be accesses via external contact elements 66 and 67.

Figure 6G:
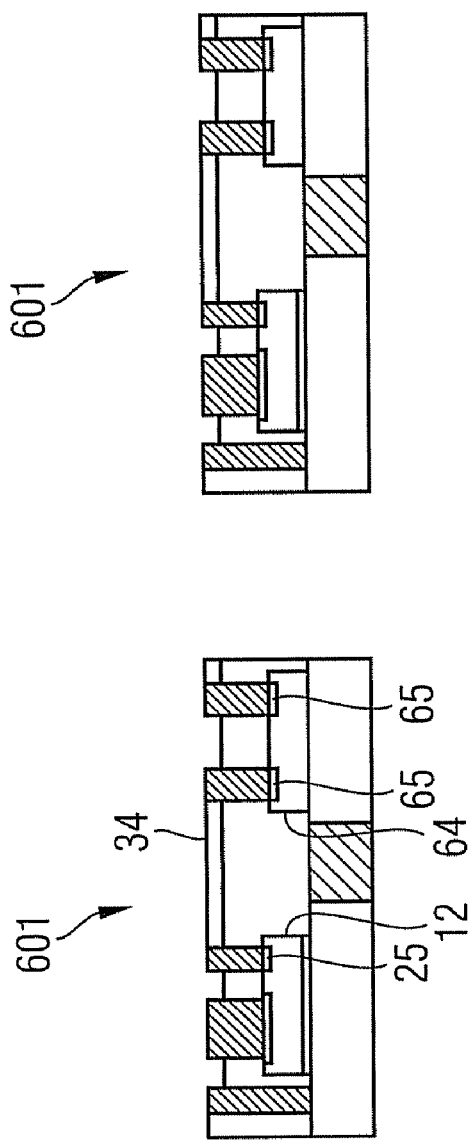

A variation of the device 600 is schematically illustrated in FIG. 6G. The device 601 illustrated there has an electrical connection between one of the contact pads 65 of the control semiconductor chip 64 and the control electrode 25 of the power semiconductor chip 12. This electrical connection is produced by the metal layer 34. Due to the electrical connection the power semiconductor chip 12 can be directly controlled by the control semiconductor chip 64 without any further wiring on the circuit board, to which the device 601 may be attached.

Figure 7A:
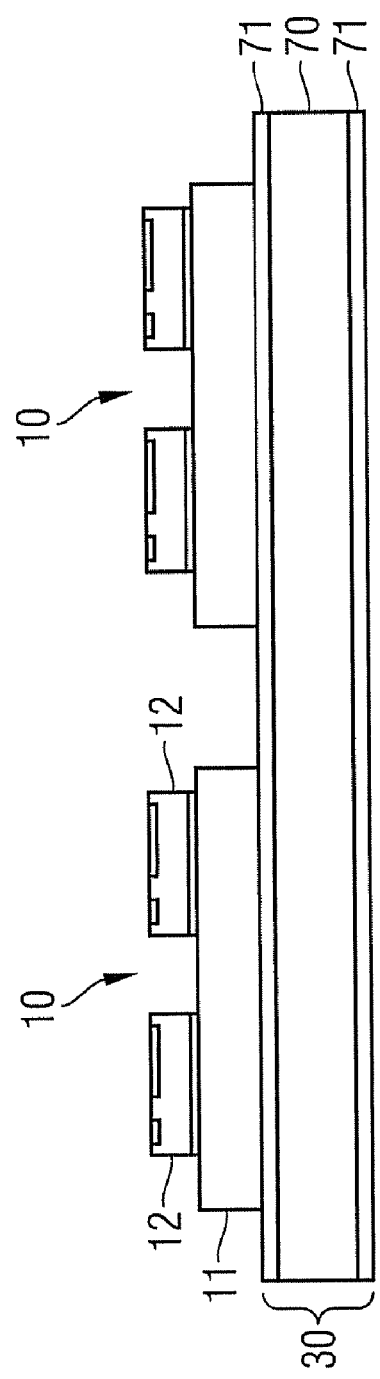
FIGS. 7A and 7B schematically illustrate a cross-sectional view of yet a further variation of the method illustrated in FIGS. 2A to 2K.
Figure 7B:
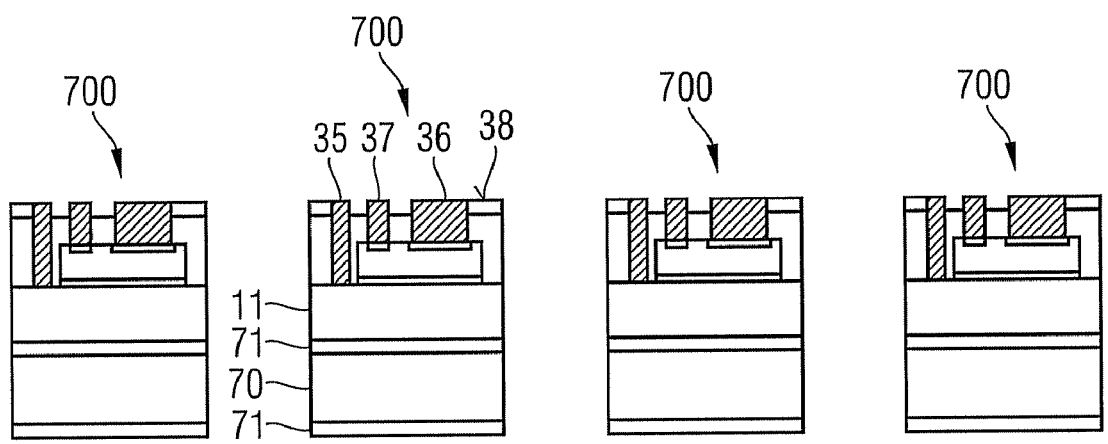

A further variation of the fabrication method illustrated in FIGS. 2A to 2K is schematically illustrated in FIGS. 7A and 7B. In the embodiment illustrated in FIG. 7A the common carrier 30, to which the modules 10 are attached, is a DCB (direct copper bonded). The DCB 30 includes an electrically insulating ceramic carrier 70, which is for example made of $Al_2O_3$, AlN, BN or TiN, and copper layers 71 attached to both sides of the ceramic carrier 70. In contrast to the method illustrated in FIGS. 2A to 2K, the modules 10 are firmly attached to the DCB 30 and the DCB 30 is not removed during the fabrication so that each of the devices 700 obtained by the fabrication method and illustrated in FIG. 7B contains a part of the DCB 30. When the devices 700 are singulated, the DCB 30 is also singulated, for example by sawing, cutting, milling, laser ablation or etching. The other fabrication processes of the devices 700 may be similar or identical to the fabrication processes illustrated in FIGS. 2A to 2K.

Figure 8:
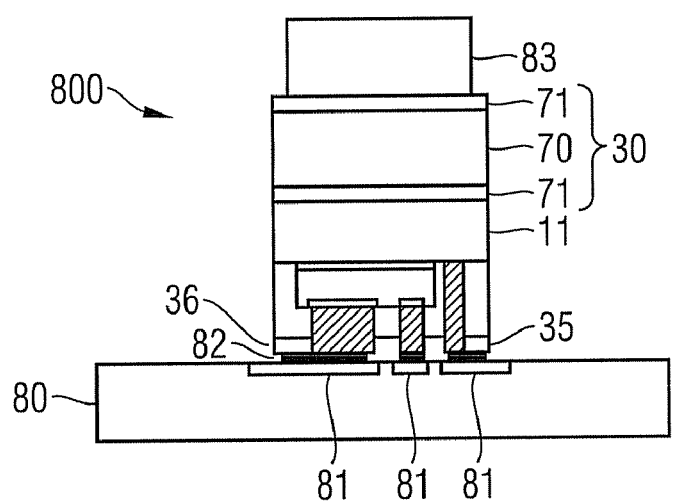
FIG. 8 schematically illustrates a cross-sectional view of one embodiment of a system including a device mounted on a circuit board.

FIG. 8 schematically illustrates a cross-sectional view of a system 800 including one of the devices 700 mounted on a circuit board 80, for example a PCB. The circuit board 80 includes contact pads 81 to which the external contact elements 35, 36 and 37 of the device 700 are soldered using solder deposits 82. On top of the device 700, a heat sink 83 may be attached. Due to the ceramic layer 70 of the DCB 30, the heat sink 83 is electrically insulated from the carrier 11 and the semiconductor chip 12. During operation, the thermal conductivity of the carrier 70 allows to transfer the heat generated by the semiconductor chip 12 to the heat sink 83 where the heat is dissipated.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a device, comprising:
   providing a plurality of modules, each of the modules comprising a carrier having a first surface and an opposing second surface, and at least one semiconductor chip attached to the first surface of the carrier with the at least one semiconductor chip having a first face facing the first surface of the carrier and an opposing second face;
   applying a continuous dielectric layer to and over the second face of the semiconductor chip and to and over portions of the first surface of the carrier not covered by the at least one semiconductor chip of each of the plurality modules to form a contiguous workpiece;
   structuring the dielectric layer to open at least one of the semiconductor chips; and
   singulating the workpiece to obtain a plurality of devices.

2. The method of claim 1, comprising placing the modules on a common carrier before the application of the dielectric layer.

3. The method of claim 2, wherein the common carrier is at least 10 times larger than the carrier of at least one of the modules.

4. The method of claim 2, comprising removing the common carrier from the modules after the application of the dielectric layer.

5. The method of claim 2, comprising firmly attaching the modules to the common carrier and singulating the common carrier when singulating the workpiece.

6. The method of claim 2, wherein the common carrier is a ceramic carrier and metal layers are attached to opposite faces of the ceramic carrier.

7. The method of claim 2, comprising placing a template on the common carrier to cover gaps between the modules placed on the common carrier.

8. The method of claim 2, comprising forming recesses in the common carrier to receive the modules.

9. The method of claim 1, comprising laminating the dielectric layer on the modules.

10. The method of claim 1, wherein the modules are unconnected among each other when provided.

11. The method of claim 1, wherein the dielectric layer comprises an electrically insulating layer and an electrically conductive layer.

12. The method of claim 11, wherein the electrically conductive layer faces away from the modules when applying the dielectric layer to the modules.

13. The method of claim 1, wherein the carrier of at least one of the modules is at least one of a metal foil, a metal plate, a structured metal plate, a ceramic plate, a laminated substrate and an electrically insulating substrate.

14. The method of claim 1, wherein the semiconductor chip of at least one of the modules comprises a first electrode on a first face and a second electrode on a second face opposite to the first face.

15. The method of claim 14, comprising attaching the semiconductor chip to the carrier with its first face facing the carrier.

16. The method of claim 14, wherein the semiconductor chip is a power semiconductor chip.

17. The method of claim 1, comprising depositing electrically conductive material is on the at least one semiconductor chip opened by structuring the dielectric layer.

18. The method of claim 17, comprising galvanically depositing the electrically conductive material.

19. The method of claim 1, wherein at least two modules of the plurality of modules comprise different carriers.

20. The method of claim 1, wherein at least two modules of the plurality of modules comprise different semiconductor chips.

* * * * *